United States Patent [19]

Evans

[11] 4,268,739
[45] May 19, 1981

[54] AUTOMATED WIRING APPARATUS

[75] Inventor: Evan J. Evans, Longview, Tex.

[73] Assignee: United Wiring & Manufacturing Co., Longview, Tex.

[21] Appl. No.: 884,376

[22] Filed: Mar. 9, 1978

[51] Int. Cl.³ .................. B23K 1/12; B23K 3/02; B23K 3/06; B65H 17/36

[52] U.S. Cl. .................. 219/56.1; 219/85 D; 219/85 F; 219/233; 228/4.5; 228/53; 29/593; 226/162

[58] Field of Search .............. 219/56.1, 56.21, 56.22, 219/86.41, 85 F, 85 G, 85 D, 91.21, 233, 230, 235; 226/158, 159, 162; 228/52, 53, 4.5; 29/593

[56] References Cited

U.S. PATENT DOCUMENTS

| | | | |
|---|---|---|---|
| 2,901,585 | 8/1959 | Baccari et al. | 228/53 |
| 2,952,232 | 9/1960 | Sipala | 228/53 |
| 3,626,086 | 12/1971 | Rubey | 174/68.5 |
| 3,734,386 | 5/1973 | Hazel | 219/56.1 X |
| 3,797,725 | 3/1974 | Mori et al. | 219/85 G X |
| 3,825,999 | 7/1974 | Rubey | 29/626 |
| 3,868,488 | 2/1975 | Kobayashi et al. | 219/85 F X |
| 3,960,309 | 6/1976 | Hazel | 219/85 F X |
| 3,999,610 | 12/1976 | Sage et al. | 226/159 X |
| 4,023,724 | 5/1977 | Wakita et al. | 228/53 X |
| 4,110,880 | 9/1978 | Peppler et al. | 29/593 X |
| 4,140,265 | 2/1979 | Morino | 219/85 F X |

FOREIGN PATENT DOCUMENTS 1363042 8/1974 United Kingdom ................. 228/4.5

OTHER PUBLICATIONS

*Electronic Packaging and Production,* vol. 17, No. 10, Oct. 1977, pp. 39, 40, 42, 46, 48, 49; "Interconnection Via Discrete Wiring" by Linda J. Jardine and Stephen E. Grossman.

*IBM Technical Disclosure Bulletin,* vol. 15, No. 12, May 1973, pp. 3837, 3838; "Automated Add-On Soldering" by Englert and Boyles.

*Primary Examiner*—B. A. Reynolds
*Assistant Examiner*—Keith E. George

[57] ABSTRACT

A wire stringing apparatus interconnects terminals of electronic components mounted upon a circuit board. A wire stringing head, which is transported on an x-y mechanism driven by a controller, wraps an insulated wire about terminals and guide pins mounted on the circuit board. The insulated wire is connected throughout the circuitry to form all of the necessary interconnections. After the wire is installed an automatic solder feeding mechanism and a heating element are transported over the circuit board to selectively solder the interconnecting wire to the appropriate component terminals. The heat generated for the soldering procedure additionally removes the insulation from the interconnecting wire at the connection terminal. A cutting tool transported over the circuit board severs the interconnecting wire at selected points to form individual conduction paths between circuit terminals. During the stringing and soldering procedures, error checking mechanisms insure that the insulation on the interconnecting wire has not been broken, that the stringing head has not missed a guide or pin, and that the soldering apparatus has produced a reliable solder connection.

4 Claims, 10 Drawing Figures

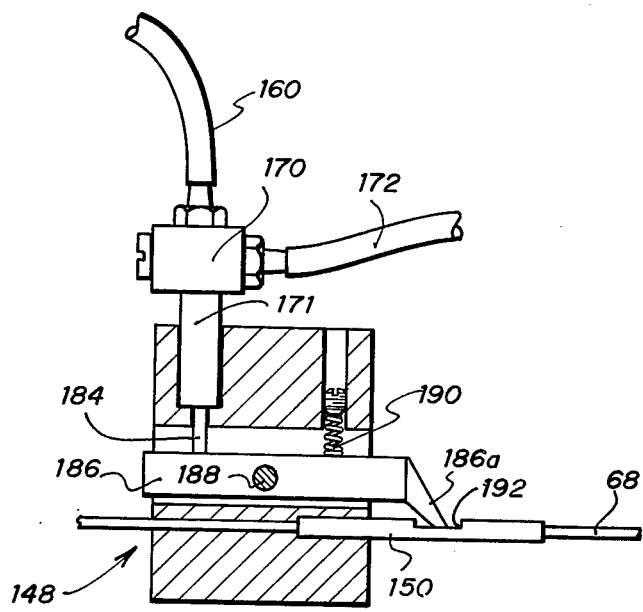
FIG. 5
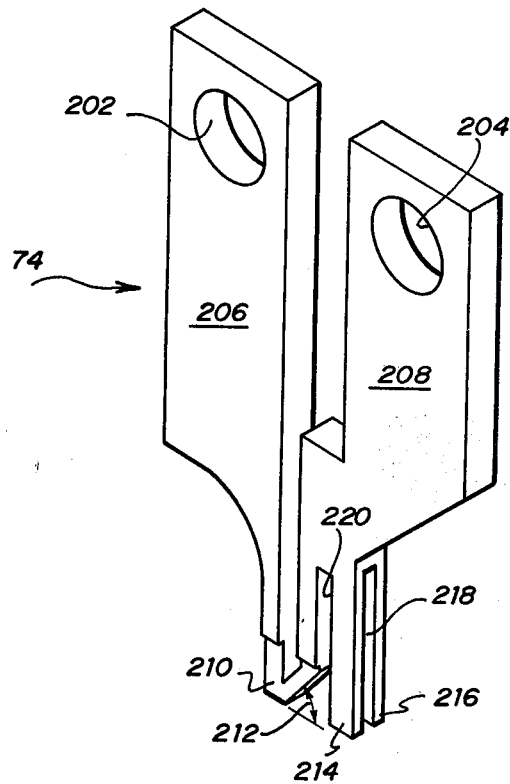
FIG. 6
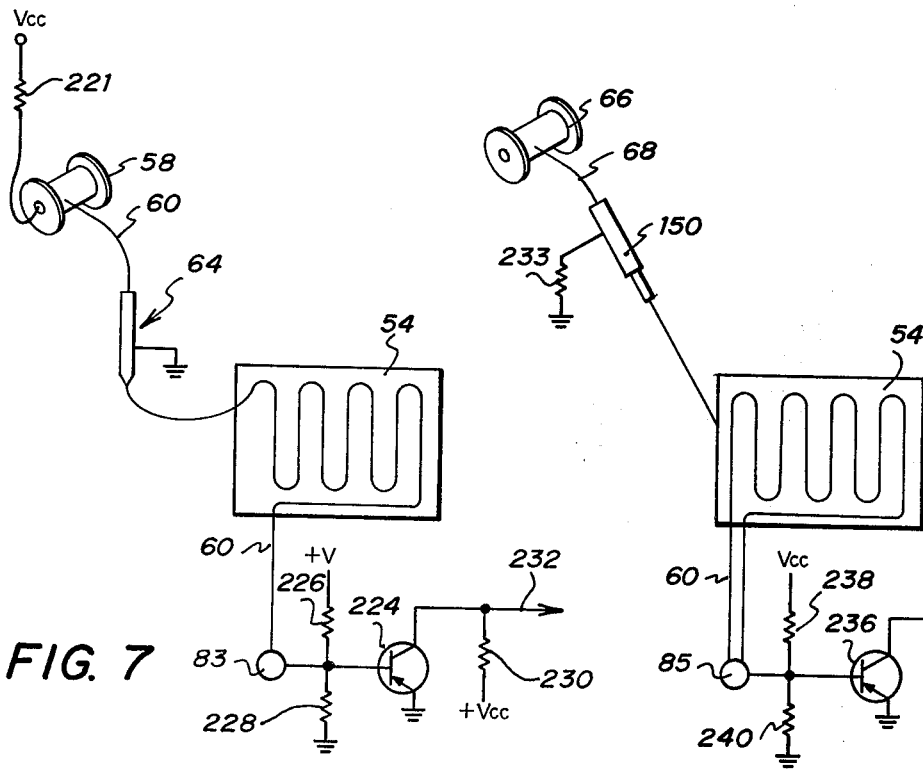
FIG. 7
FIG. 8

4,268,739

AUTOMATED WIRING APPARATUS

BACKGROUND OF THE INVENTION

This invention relates to automatic wiring of electrical circuit boards, and more particularly to apparatus for making solder connections and for detaching errors in the wiring and soldering procedure.

Heretofore, various techniques have been proposed for making circuit connections between board mounted electrical components. The most widely used technique is the printed circuit board in which circuit elements are mounted on insulated boards and connections are made by soldering leads of the element to conductive paths plated onto the boards. The circuit paths on each side of the board can be interconnected by means of plated-through holes. The resulting assembly is typically referred to as a "printed circuit". This technique has disadvantages in that it has a low packing density of circuit elements and requires expensive and time consuming art work for designing the conducting paths.

Another approach is the technique of wire wrapping. Conductive pins with square or rectangular cross-sections extend from circuit components and are interconnected by tightly wrapping an insulated wire about the pin. The wire must be wrapped tightly about the pin to insure contact at the sharp corners. This technique requires an inventory of variously sized sockets and tools to perform the interconnection process. In addition, where insulated wire is used, it is necessary to pre-strip the ends of each wire. These characteristics result in a very high unit cost per electrical connection.

In order to reduce costs and avoid the disadvantages associated with the above techniques, an interconnection process of wire stringing has been developed as described in U.S. Pat. Nos. 3,626,086 and 3,825,999 to Rubey. These patents show the stringing of insulated wire between protruding fingers attached to plated pads on a circuit board. The connecting leads of circuit components are soldered to the pads which are interconnected by the stringing of the wire.

The latter patent discloses a method and apparatus for forming electrical connections to circuit components using wire stringing wherein aligned conductive areas are plated onto opposite sides of an insulated board and are interconnected by means of a plated-through hole. T-shaped guide strips are used to guide and support the interconnecting wire along predetermined paths. The connection terminals are heated to remove the insulation from the wire and to melt solder thereby joining the wire to the terminal. And as a final step, unnecessary interconnections are removed by cutting the insulated wire at selected points.

SUMMARY OF THE INVENTION

An automatic wire stringing device is disclosed wherein a controller driven x-y mechanism guides a single wire between the interconnections of components mounted on a supporting board. A wire stringing head raises and lowers the wire while stringing it between the component terminals. After the wire is installed, automatic soldering apparatus dispenses a measured quantity of solder to a heated terminal to electrically join the wire to the terminal. The soldering apparatus comprises a fluid actuated piston disposed in a cylinder wherein the piston transports a movable tubular member through which the solder passes. A first knife edge is disposed through a first slot in the movable tubular member to draw the solder from a storage spool and push it toward the connection terminal. A second knife edge is disposed through a second slot in a static tubular member to prevent retraction of the solder when the first tubular member is transported away from the connection terminal.

During the wire installation procedure, the missing of a component terminal is detected by slack wire detecting apparatus comprising means for tensioning the wire, a rotatable member having the wire passing through colinear holes disposed on opposite sides of a pivot point, a counterbalance that tensions the rotatable member against the wire, and switch means responsive to the counterbalance for generating an error signal in response to movement of the counterbalance.

An electrical heating element is disclosed for thermally stripping insulation and melting solder, the element comprising a rectangular metallic bar having a first slot substantially dividing the bar longitudinally into two parts, a connecting bridge at the base of the bar joining the two parts and having a reduced thickness, and a guide slot for feeding solder to the connecting bridge, the guide slot being thermally decoupled from the connecting bridge.

Circuit means are provided for detecting a break in the insulation of the wire by applying a given potential to the wire and detecting a loss of that potential as an error condition. Further circuit means ground the solder, which is applied to the terminals, and detect any electrical variance of the connection terminal from ground during the soldering operation.

BRIEF DESCRIPTION OF THE DRAWINGS

For a more complete understanding of the present invention and the advantages thereof, reference is now made to the following description taken in conjunction with the accompanying drawings in which:

FIG. 5 is a side view of the feed block mechanism shown in FIG. 4,

FIG. 6 is a perspective view of a solder heating element,

FIG. 7 is a schematic diagram of a strip-wire/broken-wire error detector circuit, FIG. 8 is a schematic diagram of a solder error detector circuit.

DETAILED DESCRIPTION OF THE INVENTION

Figure 1:
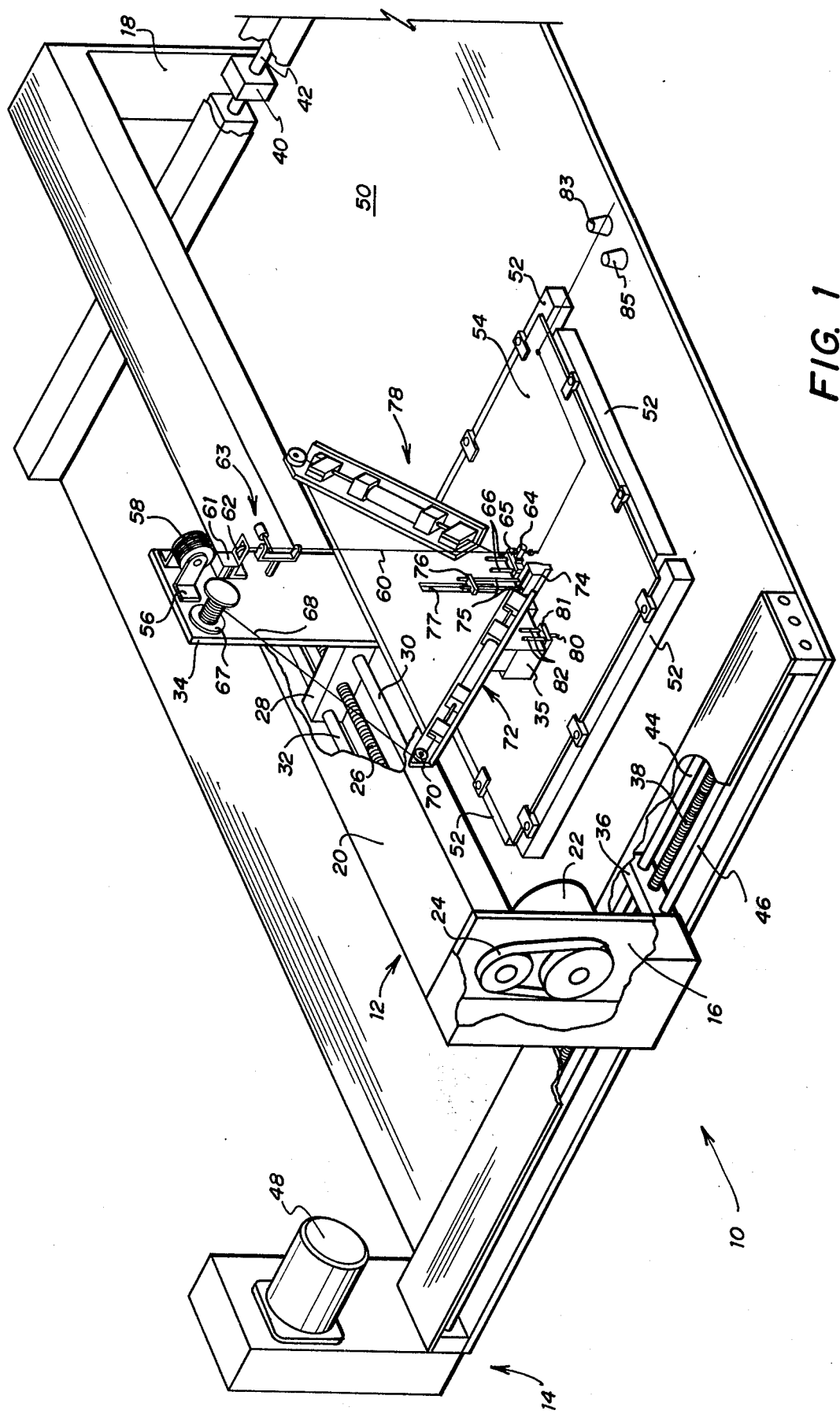
FIG. 1 is a perspective view of an x-y mechanism incorporating the present invention.

Referring now to the drawings, an automatic wire stringing machine in accordance with the present invention is illustrated in FIG. 1. The apparatus includes an x-y mechanism 10 having x-dimension transport mechanism 12 and y-dimension transport mechanism 14.

The x-dimension transport mechanism 12 comprises vertical support members 16 and 18 which carry a transverse bridge 20. A stepping motor 22 drives a belt 24 which in turn rotates a threaded shaft 26. Shaft 26 is threadedly joined to a carriage 28 which is maintained in a correct orientation by alignment bars 30 and 32. An upper mounting plate 34 is joined to the carriage 28, and a lower mounting plate 35 is joined vertically to the upper mounting plate 34. The carriage 28 and both mounting plates are free to travel the length of the transverse bridge 20.

The vertical support member 16 is joined to a second carriage 36 which is positioned along the y axis by a threaded shaft 38. The vertical support member 18 is joined to a sliding carriage 40 which traverses the bar 42. The carriage 36 is maintained in a correct orientation by alignment bars 44 and 46. The threaded shaft 38 is connected to a stepping motor 48 which transports the x-dimension machinery along the y dimension.

The x and y-dimension machinery transport the mounting plates 34 and 35 over the surface of a flat table 50 which has mounting brackets 52 joined to the table 50. The brackets 52 support and hold in place a circuit board 54 to which is attached electronic components that are to be interconnected by the wire stringing apparatus.

Joined to the upper mounting plate 34 is a bracket 56 which supports a roll 58 containing a length of wire 60. From the roll 58 the wire 60 passes through compression pads 61, a pulley 62, and a slack wire detector assembly 63 then down to a stringer head 64. Both elements 63 and 64 are described later in greater detail. Stringer head 64 is mounted on a plate 65 which is guided by rods 66.

Attached to the mounting plate 34 is a spool 67 carrying solder 68 which is fed from the spool around a pulley 70 through an automatic solder feed mechanism 72 to a solder heating element 74. Rods 75 are joined to a plate 76 which is disposed through slot 77. The rods 75 raise and lower the solder heating element 74 to apply the heating element to selected points on the circuit board 54. A second automatic solder feed mechanism 78 is mounted at approximately a 90 degree angle to the first automatic solder feed mechanism 72. A cutter 80 is supported by a plate 81 which is raised and lowerered by mechanism described later. Cutter 80 selectively cuts wire 60 after it has been strung on circuit board 54. Guide rods 82 maintain cutter plate 81 and cutter 80 in a properly aligned orientation.

Disposed on the table 50 proximate the circuit board 54 are test jacks 83 and 85. The leading end of wire 60 is connected to one then the other of these test jacks during the installation of the interconnections on the circuit board 54, as described later in detail.

Figure 2:
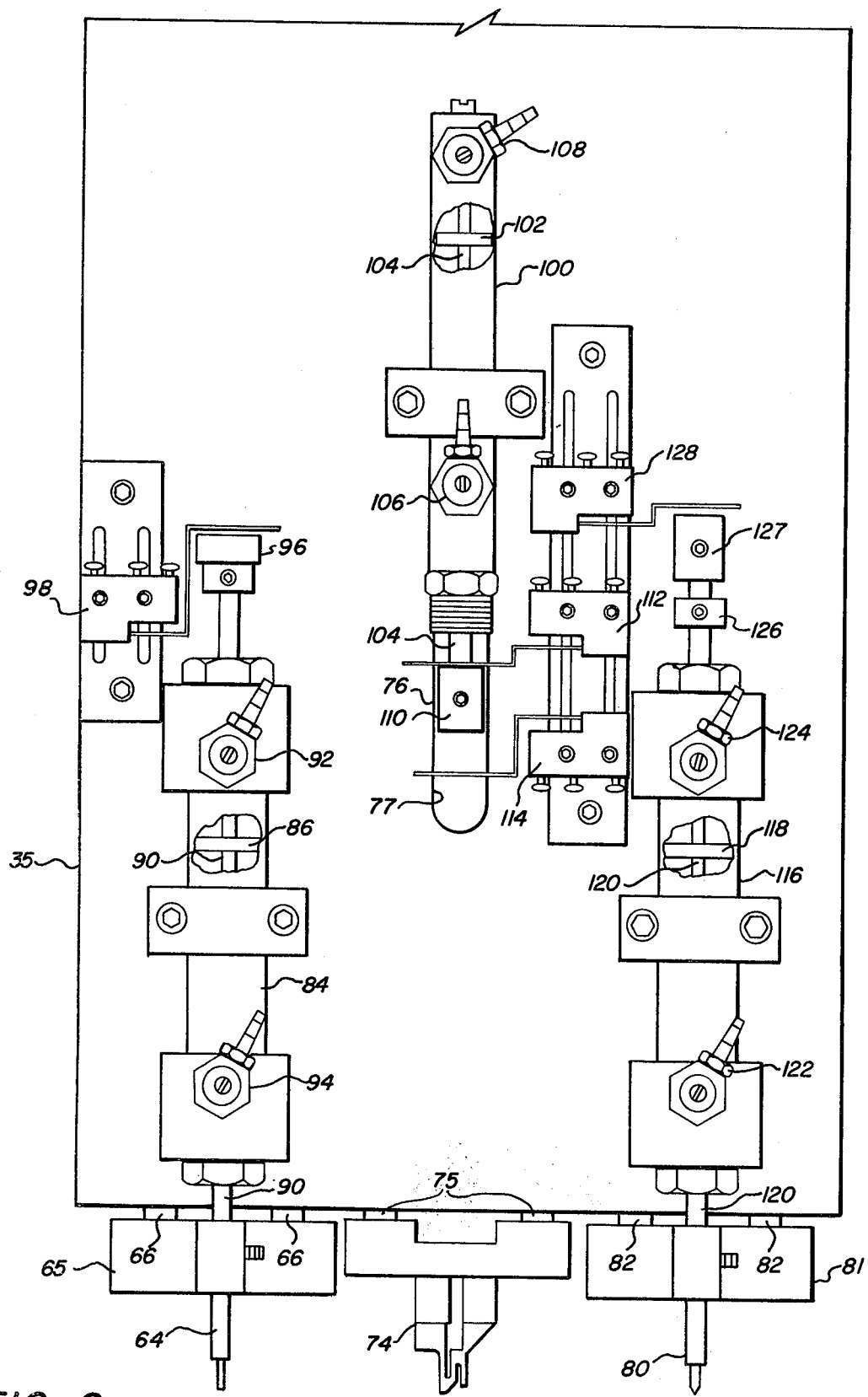
FIG. 2 is an elevation view of wire stringer, solder head, and cutter pneumatic cylinders.

The reverse side of lower mounting plate 35 is shown in FIG. 2. The stringer head 64 is raised and lowered by means of a pneumatic cylinder 84 having a piston 86 disposed therein. a shaft 90 joins the piston 86 to plate 65 which supports the stringer head 64. Compressed air is supplied through a connector 92 to force piston 86 to travel downward and cause stringer head 64 to be lowered toward circuit board 54. Application of compressed air to connector 94 forces piston 86 to be raised which in turn raises the stringer head 64. A collar 96 disposed on the shaft 90 limits the travel of the shaft and activates a microswitch 98 each time the stringer head 64 is moved to the raised position.

The solder heating element 74 is raised and lowered by means of a pneumatic cylinder 100 having piston 102 disposed therein. Piston 102 is joined to shaft 104 which is connected to plate 76 which extends through slot 77 where it joins rods 75. Solder heating element 74 is raised by applying compressed air to connector 106 and is lowered by supplying compressed air to connector 108. A collar 110 limits the travel of shaft 104 and activates a microswitch 112 when the solder heating element 74 is moved into the upper position and activates a microswitch 114 when the solder heating element 74 is moved into the lower position.

The cutter 80 is raised and lowered by means of a pneumatic cylinder 116 which has a piston 118 disposed therein. Piston 118 is connected to shaft 120 that is connected by rods 82 to plate 81 which is in turn joined to cutter 80. Cutter 80 is raised by applying compressed air to connector 122 and lowered by applying compressed air to connector 124. A collar 126 disposed on shaft 120 limits the travel of the shaft and a collar 127 activates a microswitch 128 when the cutter 80 is transported to its upper position.

Figure 3:
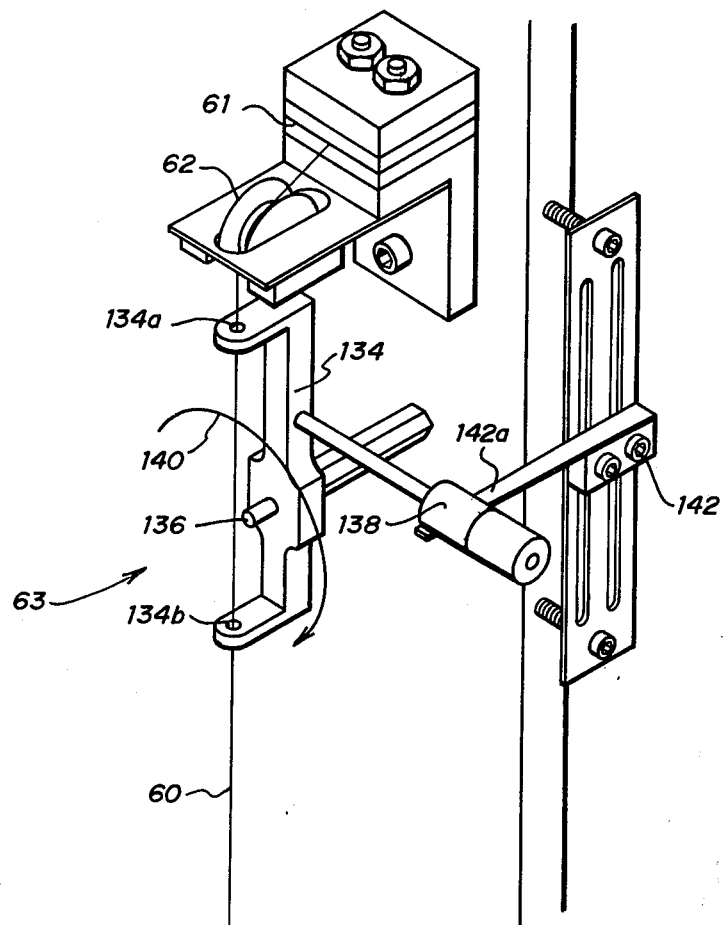
FIG. 3 is a perspective view of a stringer head and a slack wire detector.
Figure 3:
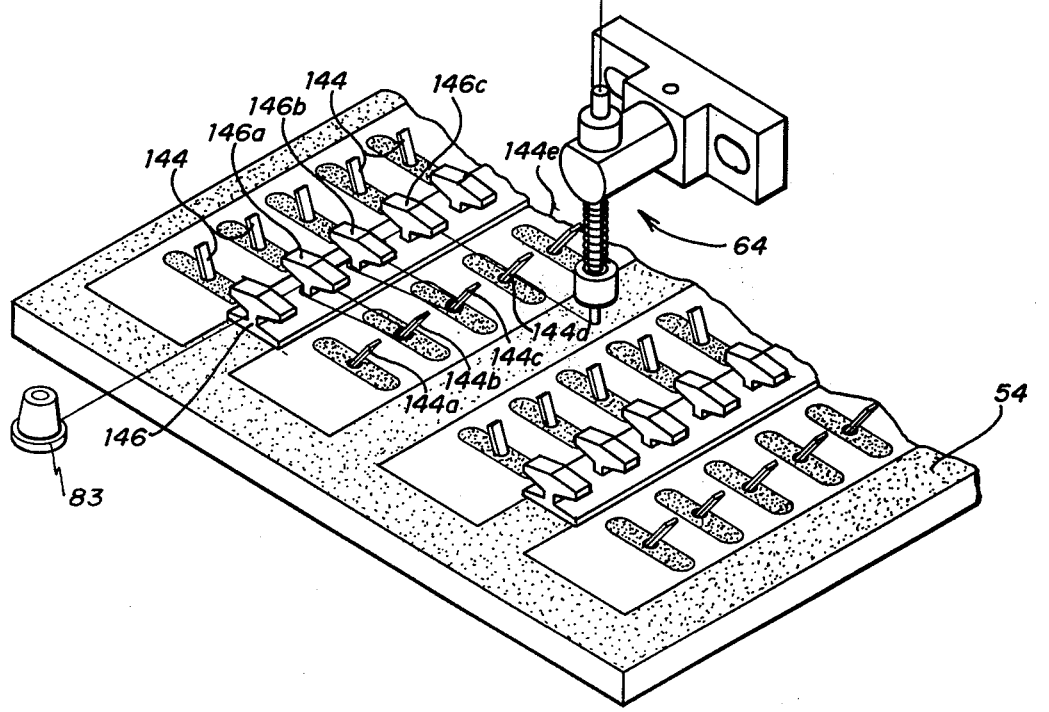

The slack wire detector assembly 63 and the stringer head 64 are shown in further detail in FIG. 3. After passing through a pair of compression pads 61 and over the pulley 62, the wire 60 passes through an arm 134 having an upper vertical hole 134a and a lower vertical hole 134b. The arm 134 pivots about a shaft 136 and has a counterweight 138 attached transversely to the upper extension of arm 134. When the counterweight 138 rotates in the direction of arrow 140, the counterweight activates a microswitch 142 by depressing microswitch arm 142a.

Operation of the wire stringing procedure is described by reference to FIGS. 1, 2 and 3. A 14 pin integrated circuit is mounted on the bottom of the circuit board 54 with lead pins 144 passing through the board and disposed at approximately a 60 degree angle to the circuit board 54. A set of guide pins 146 is disposed between the two rows of integrated circuit lead pins 144.

A sample wiring operation to interconnect pins on the circuit board 54 proceeds as follows. After the wire 60 is passed through the slack wire detector assembly 63 and the stringer head 64, it is initially connected to the test jack 83 and then wrapped around a guide pin 146a. An x-y mechanism control circuit (not shown) then increments the stepping motors 22 and 48 to move the stringer head 64 relative to the circuit board 54. The stringer head 64 is moved from the guide pin 146a to a position between the lead pins 144a and 144b where it then is lowered approximately 0.080 inch by activation of the piston 90. The stringer head traverses a complete path about the lead pin 144b to wrap the wire 60 about this lead pin. The stringer head 64 is then raised by piston 90 and is moved to guide pin 146a and the wire 60 is wrapped around guide pins 146a and 146b, then the stringer head 64 is moved to the lead pin 144c where it is lowered and the wire 60 is wrapped around lead pin 144c. From lead pin 144c the stringer head is raised and then transported to the guide pin 146b, behind this guide pin and on to guide pin 146c. The stringer head then turns about guide pin 146c where it is then transported to a point between the lead pins 144d and 144e. From this point the stringer head is further directed by command from the x-y mechanism control circuit to pay out wire 60 and interconnect additional terminals of components mounted on the circuit board 54.

As the stringer head 64 is moved, the wire 60 is pulled through the stringer head and away from storage on the roll 58. Compression pads 61 disposed immediately below the roll 58 maintain a constant frictional force on the wire 60 as it is being drawn out. Following the compression pads 61, the wire 60 is passed over a roller 62 and through the slack wire detector assembly 63.

The slack wire detector assembly 63 is illustrated in FIG. 3. Wire 60 is passed through the holes 134a and 134b. Counterweight 138 applies a force to the arm 134 tending to rotate the arm in the direction of the arrow 140. The force of the counterweight 138 is transmitted through the arm 134 and applied as transverse but oppositely directed forces on the wire 60. The counterweight 138 is adjusted in operation such that is is disposed slightly above the lever arm 142a that actuates the microswitch 142. If during the stringing operation the wire 60 should fail to be wrapped about an integrated circuit lead pin or a guide pin, the movement of the stringer head 64 will reduce the tension in the wire 60. This will cause the counterweight 138 to be lowered and thereby actuate the microswitch 142 through the lever arm 142a. Actuation of the microswitch 142 generates an alarm to an error detection circuit, described later, which stops the stringing operation and provides an alarm display to an operator. Thus, during the stringing operation, each wrapping point is checked by means of monitoring the wire tension.

Figure 4:
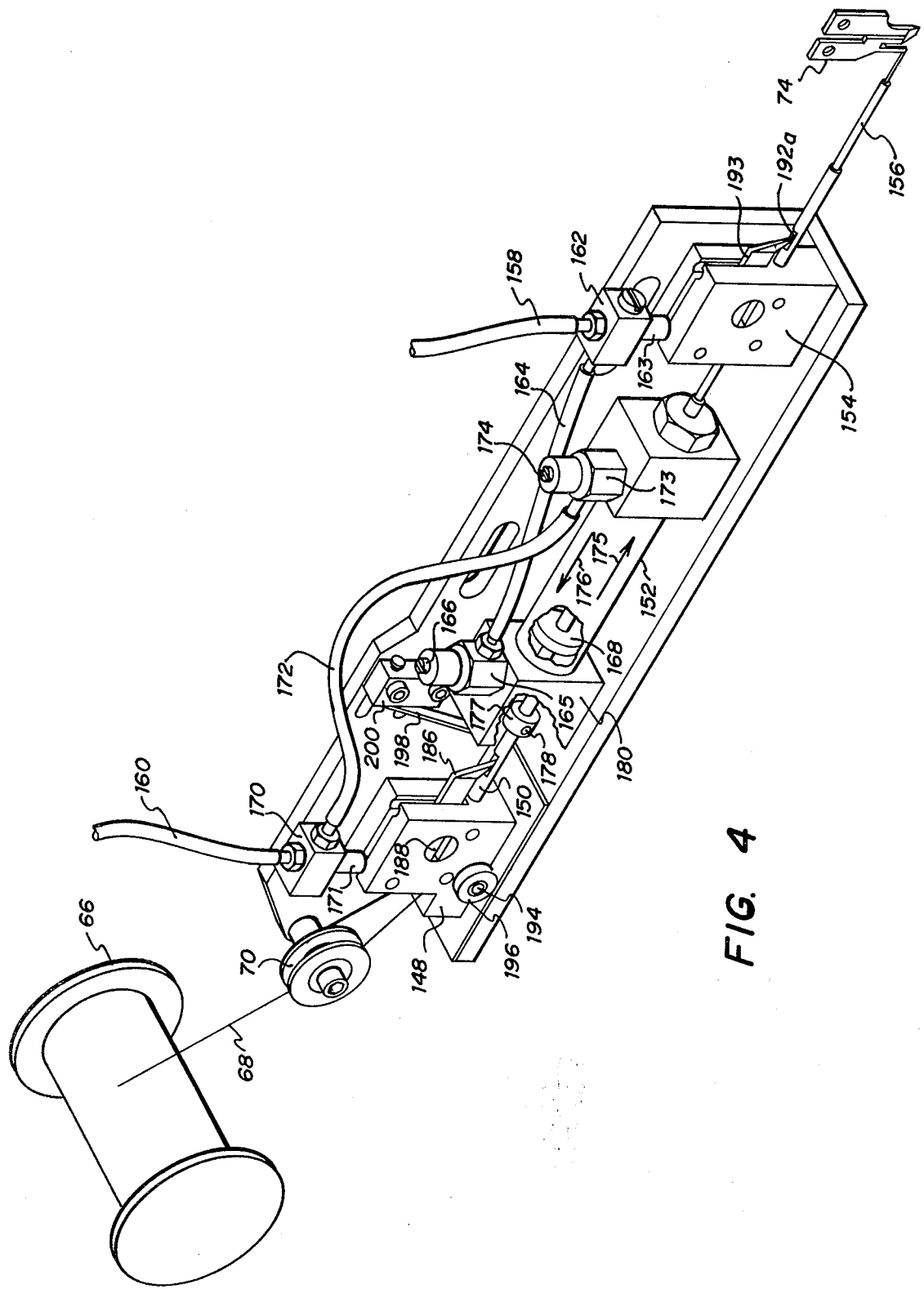
FIG. 4 is a perspective view of an automatic solder feed mechanism.

After the wire has been strung on the circuit board, each of the circuit terminals must be heated to remove the insulation from the wire and to solder the wire to the terminal in order that a reliable electrical connection may be made. The soldering apparatus and procedure is described by reference to FIGS. 1, 2 and 4. FIG. 4 illustrates the automatic solder feed mechanism 72 in detail. The automatic solder feed mechanism 72 is joined to the lower mounting plate 35 and disposed at approximately a 45 degree angle to the circuit board 54.

The solder 68 is transported from the spool 66 around the pulley 70 and into an upper feed block 148 where it enters into a feed tube 150. The solder 68 is carried through the feed tube 150 which passes through a pneumatic cylinder 152. The solder next passes through a lower feed block 154 and then to an inner feed tube 156 which delivers the solder to the solder heating element 74.

Automatic solder feed mechanism 72 is actuated by compressed air that is supplied through a feed air line 158 and a retract air line 160. Feed air line 158 is joined to a T-connector 162 which is in turn pneumatically connected to an air cylinder 163 in the lower feed block 154 and to a second feed air line 164. The second feed air line 164 is joined to a T-connector 165 which is in turn connected to a retract bleeder valve 166 and the feed side of a piston 168. Retract bleeder valve 166 releases the pressurized air from the feed side of the piston 168.

The retract air line 160 is joined to a T-connector 170 which is in turn joined to both an air cylinder 171 in the upper feed block 148 and a second retract air line 172. The second retract air line 172 is joined to a T-connector 173 which is in turn connected to a feed bleeder valve 174 and the retract side of the piston 168.

Piston 168 travels in the direction of arrow 175 to feed solder to the circuit terminal and moves in the direction of arrow 176 when retracting back over the solder 68.

A feed control collar 177 is slidably mounted on the feed tube 150 between the upper feed block 148 and a supporting block 180 beneath the feed bleeder valve 166. A set screw 178 is disposed in the feed control collar 177 to fix its position on the feed line 150. The travel of feed tube 150 is stopped when the feed control collar 177 contacts the supporting block 180.

The upper feed block 148 is illustrated in greater detail in FIG. 5. Upper feed block 148 includes a knife release air cylinder 171 containing a piston 184 that acts on an upper feed knife 186 which is pivoted on a screw 188. On the opposite side of the pivot screw 188 from the piston 184 is a control spring 190 which tensions the upper feed knife 186 against the piston 184. The upper feed knife 186 has a blade section 186a which is dimensioned to pass through a slot 192 in the feed tube 150. When air pressure is not supplied to the knife release air cylinder 171, the upper feed knife 186 is in the engaged position as shown with the control spring 190 forcing the knife blade section 186a through the slot 192 into contact with the solder 68, which is within the feed tube 150. When air pressure is supplied to the knife release cylinder 171, the piston 184 is actuated and presses against the upper feed knife 186, which is caused to rotate about the pivot screw 188 and lift the blade section 186a from the slot 192 thereby terminating contact with the solder 68. With air pressure applied as thus described the upper feed knife 186 is in the raised position.

The lower feed block 154 is constructed in the same manner as the upper feed block 148 and operates similarly with air pressure. The lower feed knife 193 is in the raised position when air pressure is applied and is in the engaged position against the solder 68 when air pressure is not applied.

As shown in FIG. 4 the upper feed block 148 is supported by a shaft 194 having a wheel 196 mounted thereon. As the feed tube 150 moves in the retract and feed directions, the upper feed block 148 is supported by the shaft 194 and wheel 196 in its back and forth motion.

The automatic soldering operation is described in reference to FIGS. 1, 2, and 4. An x-y mechanism control circuit (not shown) commands the stepping motors 22 and 48 to position the lower mounting plate 35 carrying the automatic solder feeding mechanism 72 to an appropriate location on the circuit board 54 for the formation of a solder connection at a terminal. Upon a command from a solder control circuit, described later, compressed air is supplied through connector 108 to cylinder 100 which lowers piston 102 together with plate 76 and rods 75 toward the circuit board 54 until the solder heating element 74 contacts the terminal that is to be soldered. Electrical power is then supplied to the solder heating element 74 until sufficient heat is applied to the terminal to melt the insulation on the wire 60. After the terminal is heated and the insulation is removed, the solder control circuit sends a signal which opens a solenoid valve (not shown) that supplies compressed air to the feed air line 158 (FIG. 4). When compressed air is supplied to this line, the lower feed knife 193 is lifted and the piston 168 moves in the feed direction thus transporting the feed tube 150 and the upper feed block 148 toward the solder heating element 74. At this time, no air is supplied to the retract air line 160 thereby positioning the upper feed knife 186 in its engaged position against the solder 68. Therefore, when the upper feed block 148 is moved forward, the solder is pulled from the spool 66 and pushed through the lower feed block 154 and through the inner feed tube 156. The solder is fed from the inner feed tube 156 onto the terminal which has been heated by the solder heating element 74. The solder thus fed is melted to flow around the connection and thereby form a solid electrical contact between the wire 60 and an integrated circuit lead pin.

As the feed tube 150 moves forward carrying the feed control collar 177, the collar contacts a lever arm 198 on a microswitch 200. When the microswitch 200 is activated, a signal is sent to the solder control circuit indicating that the feed operation has been completed. The collar 177 contacts the supporting block 180 to terminate the motion of the feed tube 150 thus regulating the quantity of solder that is fed to the heated terminal. Collar 177 can be adjusted to any point along the feed tube 150 to feed different quantities of solder.

Upon receipt of a feed complete signal from the microswitch 200, the solder control circuit activates solenoid valves (not shown) to remove air pressure from feed air line 158 and supply air pressure to retract air line 160. These operations cause the lower feed knife 193 to drop down into its engaged position against the solder 68 while the upper feed knife 186 is caused to lift to its raised position where it is not in contact with the solder 68. The compressed air supplied through the second retract air line 172 causes the piston 168 to move in the retract direction as shown by arrow 176, thus causing the feed tube 150 and the upper feed block 148 to move likewise. Since the lower feed knife blade section 192a is pressed tightly against the solder 68 to prevent it from moving, the upper feed block 148 slides over the solder 68 in its movement in the retract direction. The solder control circuit repeats the above procedure for each terminal point on the circuit board 54 that is to be soldered.

Bleeder valves 166 and 174 are adjusted to control the rate at which the piston 116 travels in the cylinder 100. The bleeder valve 174 controls the speed of the solder as it is applied to the connection terminal. This speed must be adjusted such that the solder is applied slowly enough so that it is melted as it reaches the terminal rather than pushing against the terminal and bending. But the speed must not be set too slow as to cause the terminal and circuit component to be overheated. The retract speed is set by bleeder valve 166 to be as rapid as possible without damaging the solder or the feed mechanism.

Referring to FIG. 2, the microswitch 112 is activated by collar 110 when solder heating element 74 is at its upper limit. Microswitch 114 is activated when the solder heating element 74 is driven to its lower limit, that is, against the circuit board 54. These microswitches are connected to the solder control circuit described in reference to FIG. 9.

The solder heating element 74 is illustrated in greater detail in FIG. 6. This heating element is an electrically resistive metal member which generates the heat necessary to vaporize the insulation from the wire 60 and to heat the component pin to a sufficient temperature to melt the solder and cause it to flow properly and form an electrical connection. Solder heating element 74 is held in position and connected to a source of electrical power by means of mounting holes 202 and 204 disposed respectively in rectangular shaped conductive bars 206 and 208. At the lower portions, both bars taper to a reduced cross-sectional area. At the lower, narrow cross-sectional portion of each bar, there is a step reduction in thickness and a connection between the bars to form a primary heating element 210. This primary heating element includes a sloping portion disposed at an angle 212, wherein the angle corresponds to the angle of the integrated circuit lead pin relative to the circuit board 54. At the lower end of bar 208 there is a solder guide comprising extensions 214 and 216 on either side of a slot 218. The solder guide is separated from the primary heating element 210 by a thermal decoupling slot 220, which is transverse to slot 218.

The solder heating element 74 is typically constructed of 303 stainless steel. In the soldering process the element 74 is heated by applying a ten volt electrical source which results in a 2 amp current. Heat is developed primarily in the high resistivity portions of the heating element. High resistivity exists in the sections with the narrowest cross-sectional area. The maximum resistivity is in the primary heating element 210. Most of the electrical power applied to the solder heating element 74 is converted to heat in the primary heating element 210.

The solder heating element 74 is applied to the circuit board 54 at a terminal to be soldered and the element is positioned so that the integrated circuit pin is flush against the angled portion of the primary heating element 210. Both the integrated circuit plan and this portion of the heating element are disposed at an angle of approximately 60 degrees. Solder is fed to the terminal through the slot 218 and onto the terminal pin. The solder is guided by means of the extension members 214 and 216 which are maintained at a temperature below the melting point of the solder by means of the thermal decoupling slot 220. Since the extension members 214 and 216 are not in the electrical current flow path, they are not resistively heated. Thus, the slot 218 serves as a guide for the incoming solder fed by the automatic soldering mechanism 72 or 78.

During the process of stringing the insulated wire 60 on the circuit board 54, there is the possibility that the insulation on the wire can be stripped and thereby create an erroneous connection. In order to detect a stripped wire, circuitry is provided as shown in FIG. 7 to generate an error signal to notify an operator. The trailing end of wire 60 on the reel 58 is connected to a positive voltage source Vcc through a resistor 221. The stringer head 64 is grounded. The leading end of the wire 60 is connected to the test jack 83 that is in turn connected to the base of a transistor 224. Voltage divider resistors 226 and 228, which are respectively connected to the voltage source Vcc and ground provide a predetermined potential to the base of transistor 224. The collector of transistor 224 is connected through a resistor 230 to the voltage supply Vcc while the emitter of the transistor is grounded.

When the stringing procedure is operating normally, the base of the transistor 224 is maintained at a high potential and the transistor is turned off and line 232 is at a high potential, thereby indicating an error free condition. But if the insulation on the wire 60 should be broken at some point and come in contact with ground potential, the base on transistor 224 will be dropped to a low potential, thereby turning the transistor on and supplying a low voltage output on the error detection line 232, which indicates that the wire 60 has been grounded. The resistor 221 prevents the current from source Vcc from damaging the wire 60 when it is grounded. Line 232 is connected to the error control circuit, described later, which thereupon terminates the stringing procedure and generates an alarm display to the operator. Upon notification of the error, the operator corrects the condition and restarts the x-y mechanism control circuit to continue the stringing operation.

Each solder operation is also monitored to insure that a good connection is made. The circuit shown in FIG. 8 provides this monitor function. Solder 68 is fed from the spool 66 through the feeder tube 150, which is grounded through a resistor 233, and then to the terminals of the components mounted on the circuit board 54. The soldering operation is performed after the wire 60 has been connected to the components on the board. Both ends of the wire 60 are connected to the test jack 85 which is in turn connected to the base of a transistor 236. The base is also connected to the center of a set of voltage dividing resistors 238 and 240, which are respectively connected to a positive voltage source Vcc and ground. The collector of transistor 236 is connected through a resistor 242 to the positive voltage source, and the emitter of the transistor is grounded. An error detection line 244 is connected to the collector of the transistor 236.

The solder 68 is not insulated and is in constant contact with the feeder tube 150 which is grounded. Therefore, the solder is at all times at ground potential. The transistor 236 is normally turned off, therefore, line 244 is at a high potential. During each soldering cycle the wire 60 should be connected to the solder 68, thereby grounding the test jack 85. The grounding of this terminal turns the transistor 236 on and supplies a low potential through line 244. If this cycle of normally high voltage followed by a low voltage on line 244 during the soldering procedure does not occur, the error control circuit generates an error signal which is displayed as an alarm to the operator. A failure to ground the wire 60 can occur if there is a failure to feed solder, the supply of solder has been exhausted, the solder has not melted, or there is a missing or broken wire. After the operator finds and corrects the error, the x-y mechanism control circuit and solder control circuit are reactivated and the soldering operation continues.

Figure 9:
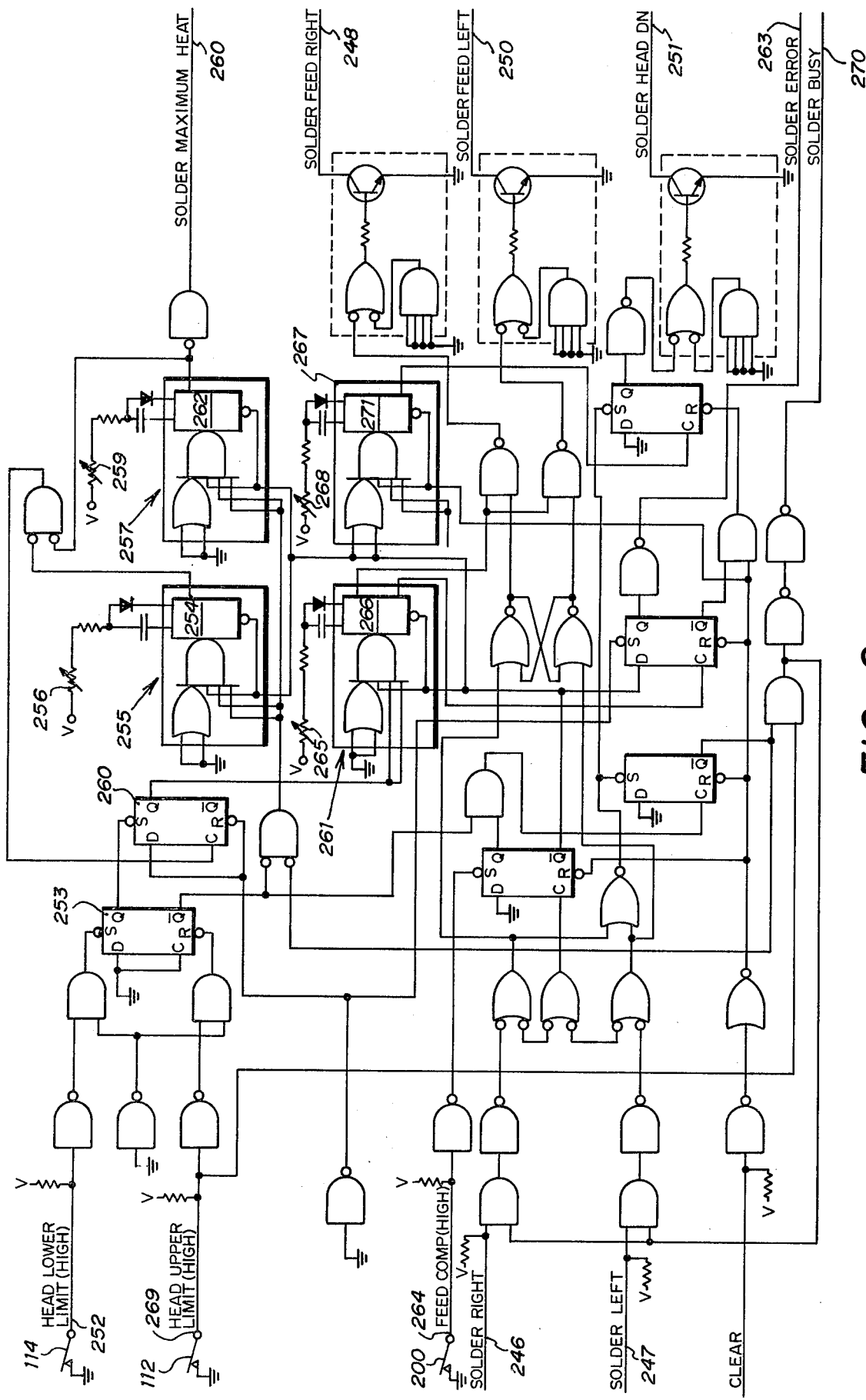
FIG. 9 is a logic diagram of a solder control circuit.

A schematic diagram of the control logic for the automatic soldering process is shown in FIG. 9.

The soldering cycle is initiated by a command from a control unit (not shown) which supplies a high logic level to either line 246 or 247 to initiate either the right-hand automatic solder feed mechanism 78 or the left-hand automatic solder feed mechanism 72 as required. These input commands are carried through the control logic and are provided as control signals to solenoid valves (not shown) on lines 248 and 250. The solenoid valves thus activated supply pneumatic pressure to the solder feed mechanism.

Upon receipt of a solder cycle initiation command on either lines 246 or 247, a signal is generated on line 251 which activates a solenoid valve that supplies air pressure to the pneumatic cylinder 100 which lowers the solder heating element 74 down to the circuit board 54.

When the solder heating element 74 reaches its lower limit, microswitch 114 is activated and provides a high logic level signal on a line 252. The command on line 252 sets a flip-flop 253 which in turn starts a preheat timer 255. Solder heating element 74 is maintained with at least a minimum heat level during the entire soldering procedure. Added heat is provided by the solder heating element 74 when in contact with the wire 60 in order to vaporize the insulation thereon. The preheat timer 255 determines the length of time that the normal heat level is applied to the terminal before the maximum heat is applied. Included in preheat timer 255 is a one-shot multivibrator 254. The duration of time of the preheat timer 255 is determined by a variable resister 256.

When the preheat timer 255 has timed out, a strip timer 257 is initiated. This timer provides a signal on a line 260 which increases the heat generated by the solder heating element 74 in order to strip the insulation from the wire 60. The duration of this timer is set by a variable resister 259. A one-shot multivibrator 262 is included as a part of strip timer 257.

After the strip timer 257 maximum heat period has been completed, a flip-flop 260 is set which in turn starts a solder feed timer 261. This timer provides an error check feature by generating an error signal on a line 263 if the soldering process is not completed within a predetermined time with completion indicated by receipt of a signal on a feed complete line 264. Feed completion is indicated by activation of microswitch 200. The duration of this timer is determined by a variable resister 265. A one-shot multivibrator 266 is included in solder feed timer 261.

After the feed complete signal has been received on line 264, a post heat timer 267 is initiated. This timer maintains the solder heating element 74 in the lower position in contact with the terminal to be soldered in order to provide additional heat to cause the solder to flow and adequately cover all the surfaces involved. The duration of this timer is determined by a variable resister 268. Included as part of post heat timer 267 is a one-shot multivibrator 271. After the post heat timer 267 has timed out, it provides for generating a command on line 251 which raises the solder heating element 74 to its upper position. Successful raising of the solder heating element 74 is indicated by activation of microswitch 112 which provides a low level signal on line 269. This signal indicates that the solder heating element 74 has returned to its upper position and resets flip-flop 253 to prepare the solder control logic to start a new solder cycle.

During the time that a solder cycle is in process, a busy command is provided on a line 270 to prevent the reading of further soldering commands from a paper tape reader (not shown) until the pending solder operation is completed.

The one-shot multivibrators 254, 262, 266 and 271 are Texas Instruments integrated circuits model 74122.

Figure 10:
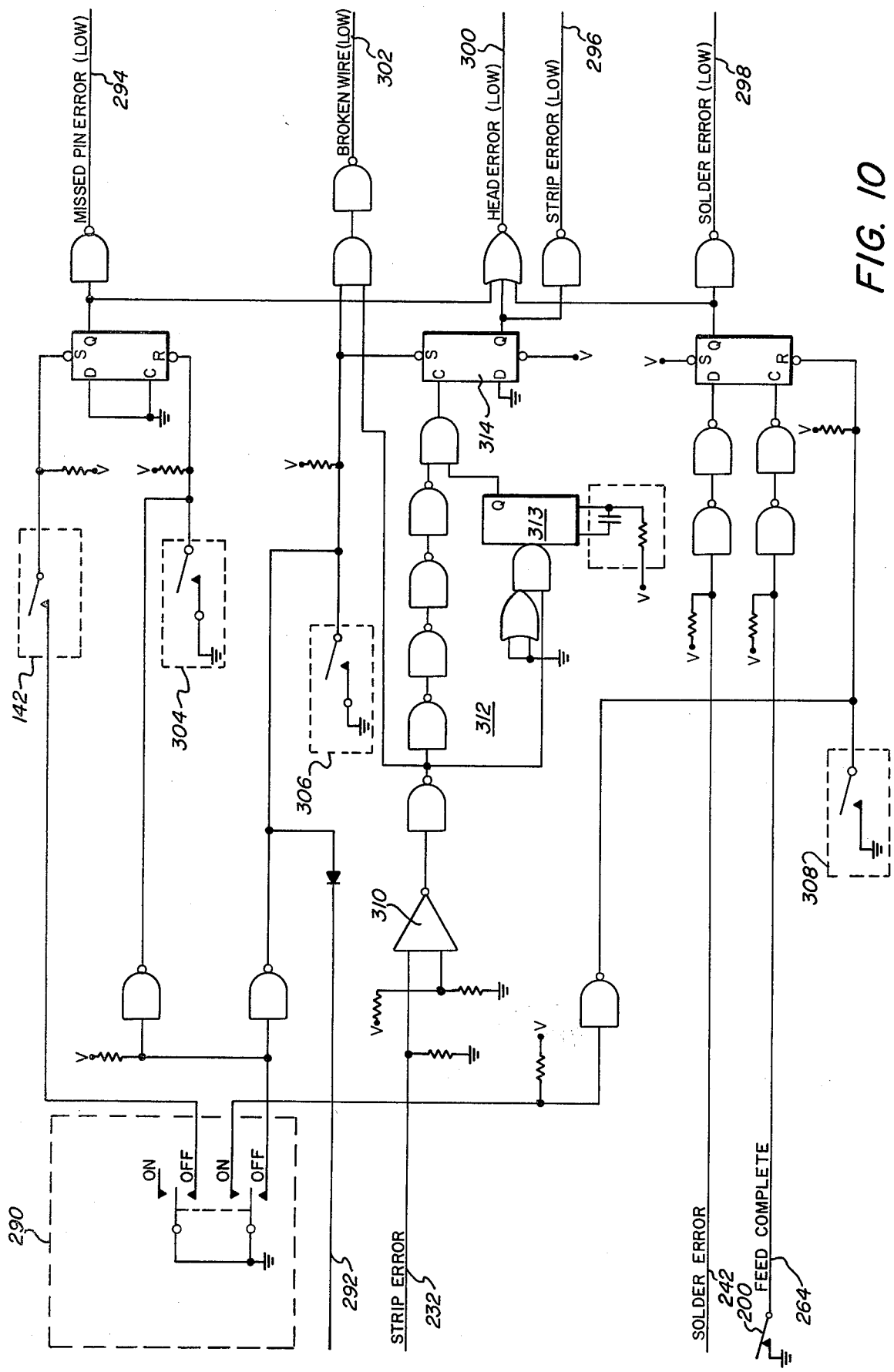
FIG. 10 is a logic diagram of an error detection circuit.

Error detection control logic is shown in FIG. 10. The stringer head 64, as previously described, is moved between up and down positions. The selection of either the soldering or stringing operation is made by appropriate operation of the manual switch 290 which is mounted on an operator panel (not shown).

During the stringing process, the pneumatic cylinder 84 with piston 86 (FIG. 2) is actuated by compressed air supplied through a solenoid valve opened by a low logic level signal on line 292.

A break in the insulation on the wire 60 is indicated on line 232, as shown in FIG. 7, as a voltage below a predetermined threshold which, in this embodiment, is two volts. A solder error, as described in reference to FIG. 8, is indicated on line 242 as a high logic level signal. A feed complete signal, as described in reference to FIG. 9, is provided on line 264 when the solder feeding operation has been completed.

When the slack wire detector microswitch 142, described in FIG. 3, is actuated, an error signal is generated on line 294 indicating that the stringing operation has missed either a lead pin or a guide pin. This signal generates an alarm light that informs the operator of the error.

If a break is detected in the insulation on the wire 60, as indicated on line 232, an error signal is generated on line 296 to activate a lamp to indicate the error to the operator. Likewise, if a solder error signal is received on line 242, an error signal is generated on line 298 to inform the operator.

When error signals are indicated on any of the lines 294, 296 or 298, a head error signal is generated on line 300 to stop the operation in progress until the error is repaired by the operator and the error control circuit is reset. If after a strip error on line 296 has stopped the operation of the machine, as indicated by a head error on line 300, and the operator has repaired the mistake, but a strip error indication continues to exist, an error signal will be indicated on the broken wire line 302 which will light a lamp to warn the operator, but will not stop the operation of the machine.

After a soldering or stringing operation has been terminated due to an error indication of either a missed pin, strip error, or solder error, the operator can repair the error and resume the interrupted operating procedure by activating the appropriate missed pin indicator switch 304, strip error indicator switch 306 or solder error indicator switch 308.

The strip error signal on line 232 is detected by a comparator 310 which determines when the voltage level on line 232 crosses below a predetermined threshold. In order to prevent an error indication when there is only an insignificant amount of missing insulation and to eliminate meaningless transients from the system, a strip error delay circuit 312 is provided to eliminate any strip error signals with a duration of less than three milliseconds. A one-shot multivibrator 313 is included as part of the delay circuit 312 and comprises a Texas Instruments model 74122 integrated circuit. If an error signal lasts for this length of time, it is determined to be a valid error and the flip-flop 314 is set and a strip error signal is generated on line 296.

Therefore, in accordance with the present invention there is provided an automated apparatus for wiring and soldering the interconnections between component terminals mounted on a component board. Each step of the operation is checked and, if not properly executed, an appropriate error signal is generated to inform the operator of the mistake.

Although several embodiments of the invention have been illustrated in the accompanying drawings and described in the foregoing detailed description, it will be understood that the invention is not limited to the embodiments disclosed, but is capable of numerous rearrangements, modifications and substitutions without departing from the scope of the invention.

What is claimed is:

1. Apparatus for soldering an electrical wire at a connection to a terminal, comprising:
    means for dispensing solder to the terminal, and
    an electrical heating element for melting the solder dispensed at the terminal by said means for dispensing, said electrical heating element including:
    an electrically resistive plate,
    a first slot extending along a substantial portion of the length of said plate essentially dividing said plate into two parts,
    a connecting bridge joining together the ends of said two parts and having a lesser thickness than that of said two parts, and
    a pair of extension members joined to one of said parts, essentially parallel to said first slot and thermally decoupled from said connecting bridge.

2. Apparatus as recited in claim 1 wherein said connecting bridge has a surface portion disposed at an acute angle to a working surface supporting the connecting terminal.

3. Apparatus as recited in claim 1 including means for detecting the continuity between the solder dispensed to the terminal and the electrical wire connected thereto, said means for detecting including:
    a grounded tubular member having the solder passing therethrough and contacting said tubular member, and
    first means for detecting ground potential on the electrical wire.

4. Apparatus as recited in claim 3, wherein said first means comprises:
    (a) a transistor having said wire connected to the control terminal thereof, and
    (b) second means for biasing said transistor to have a first output state when the wire is at ground potential and a second output state when the wire is not at ground potential.

* * * * *